US010854736B2

(12) United States Patent
Kelly et al.

(10) Patent No.: US 10,854,736 B2
(45) Date of Patent: *Dec. 1, 2020

(54) METHOD FOR FORMING SEMICONDUCTOR STRUCTURE WITH CONTACT OVER SOURCE/DRAIN STRUCTURE

(71) Applicant: TAIWAN SEMICONDUCTOR MANUFACTURING CO., LTD., Hsinchu (TW)

(72) Inventors: Andrew Joseph Kelly, Hengshan Township (TW); Yusuke Oniki, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/105,830

(22) Filed: Aug. 20, 2018

(65) Prior Publication Data

US 2018/0374936 A1  Dec. 27, 2018

Related U.S. Application Data

(63) Continuation of application No. 15/152,205, filed on May 11, 2016, now Pat. No. 10,056,472, which is a (Continued)

(51) Int. Cl.
*H01L 29/66* (2006.01)
*H01L 29/08* (2006.01)
(Continued)

(52) U.S. Cl.
CPC ........ *H01L 29/66795* (2013.01); *B82Y 10/00* (2013.01); *H01L 21/32134* (2013.01);
(Continued)

(58) Field of Classification Search
CPC .................. H01L 21/823431; H01L 29/66795
See application file for complete search history.

(56) References Cited

U.S. PATENT DOCUMENTS 5,989,988 A * 11/1999 Iinuma ............... H01L 21/28052
257/E21.165
6,562,726 B1 * 5/2003 Torek ..................... G03F 7/423
134/1.2
(Continued)

FOREIGN PATENT DOCUMENTS

KR         10-1220522 B1     1/2013
KR    10-2014-0095297 A     8/2014
(Continued)

*Primary Examiner* — Moazzam Hossain
(74) *Attorney, Agent, or Firm* — Birch, Stewart, Kolasch & Birch, LLP

(57) ABSTRACT

Methods for manufacturing semiconductor structures are provided. The method for manufacturing a semiconductor structure includes forming a source/drain structure over a substrate and forming a metal layer over the source/drain structure. The method for manufacturing a semiconductor structure further includes reacting a portion of the metal layer with the source/drain structure to form a metallic layer by using an etching solvent. In addition, the etching solvent includes (a) a first component and (b) a second component. The first component includes an acid, and the second component includes propylene carbonate (PC), ethylene carbonate (EC), diethyl carbonate (DEC), or a combination thereof.

20 Claims, 21 Drawing Sheets

Related U.S. Application Data continuation of application No. 14/525,888, filed on Oct. 28, 2014, now Pat. No. 9,385,197.

(60) Provisional application No. 62/043,836, filed on Aug. 29, 2014.

(51) Int. Cl.

| | | |
|---|---|---|
| *H01L 29/78* | (2006.01) | |
| *H01L 21/3213* | (2006.01) | |
| *B82Y 10/00* | (2011.01) | |
| *H01L 29/775* | (2006.01) | |
| *H01L 29/06* | (2006.01) | |
| *H01L 21/8234* | (2006.01) | |
| *H01L 29/417* | (2006.01) | |
| *H01L 29/45* | (2006.01) | |

(52) U.S. Cl.
CPC ........ *H01L 21/823418* (2013.01); *H01L 21/823431* (2013.01); *H01L 29/0676* (2013.01); *H01L 29/0847* (2013.01); *H01L 29/41791* (2013.01); *H01L 29/45* (2013.01); *H01L 29/66439* (2013.01); *H01L 29/775* (2013.01); *H01L 29/785* (2013.01); *H01L 29/068* (2013.01)

(56) References Cited

U.S. PATENT DOCUMENTS

| | | |
|---|---|---|
| 8,278,191 B2 | 10/2012 | Hildreth et al. |
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 9,093,298 B2 | 7/2015 | Ekbote et al. |
| 9,093,514 B2 | 7/2015 | Tsai et al. |
| 9,236,267 B2 | 1/2016 | De et al. |
| 9,245,805 B2 | 1/2016 | Yet et al. |
| 9,520,482 B1 | 12/2016 | Chang et al. |
| 9,576,814 B2 | 2/2017 | Wu et al. |
| 2005/0051900 A1 | 3/2005 | Liu et al. |
| 2008/0224238 A1 | 9/2008 | Kanakasabapathy et al. |
| 2010/0248449 A1 | 9/2010 | Hildreth et al. |
| 2011/0062411 A1 | 3/2011 | Bangsaruntip et al. |
| 2011/0073952 A1* | 3/2011 | Kwok ............ H01L 29/045 257/368 |
| 2011/0210404 A1 | 9/2011 | Su et al. |
| 2012/0025282 A1 | 2/2012 | Doris et al. |
| 2012/0064712 A1 | 3/2012 | Lei et al. |
| 2012/0074498 A1 | 3/2012 | Chuang et al. |
| 2013/0113027 A1 | 5/2013 | Chiang et al. |
| 2013/0277752 A1 | 10/2013 | Glass et al. |
| 2013/0307034 A1 | 11/2013 | Yin et al. |
| 2014/0042500 A1 | 2/2014 | Wann et al. |
| 2014/0061817 A1 | 3/2014 | Gan et al. |
| 2014/0065782 A1 | 3/2014 | Lu et al. |
| 2014/0179077 A1 | 6/2014 | Chen et al. |
| 2014/0197458 A1 | 7/2014 | Ching et al. |
| 2014/0203370 A1 | 7/2014 | Maeda et al. |
| 2014/0291734 A1* | 10/2014 | Cheng ............ H01L 21/84 257/288 |
| 2015/0214059 A1* | 7/2015 | Bouche ............ H01L 21/2807 257/369 |
| 2015/0325482 A1 | 11/2015 | Hu et al. |

FOREIGN PATENT DOCUMENTS

| | | |
|---|---|---|
| TW | 200511446 A | 3/2005 |
| TW | 201137942 A1 | 11/2011 |
| TW | 201225294 A1 | 6/2012 |
| TW | 201403824 A | 1/2014 |

\* cited by examiner

METHOD FOR FORMING SEMICONDUCTOR STRUCTURE WITH CONTACT OVER SOURCE/DRAIN STRUCTURE

PRIORITY CLAIM AND CROSS-REFERENCE

This Application claims the benefit of U.S. Provisional Application No. 62/043,836, filed on Aug. 29, 2014, and entitled "Semiconductor structure with strained source and drain structure and method for forming the same", the entirety of which is incorporated by reference herein.

This application is a Continuation application of U.S. patent application Ser. No. 15/152,205 filed on May 11, 2016, which is a Continuation application of U.S. patent application Ser. No. 14/525,888, filed on Oct. 28, 2014, the entire of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figures 1, 1A:
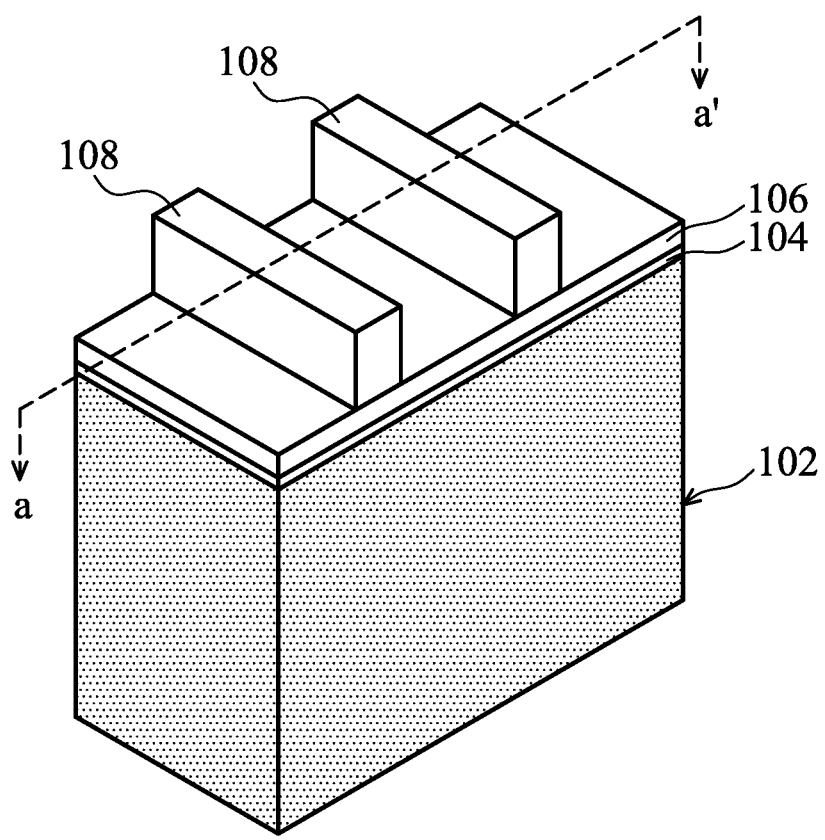
FIGS. 1A-1 to 1M are perspective and cross-sectional representations of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of a semiconductor structure are provided in accordance with some embodiments of the disclosure. The semiconductor structure includes a source/drain structure, and a metallic layer is formed over the source/drain structure. The metallic layer may be formed by forming a metal layer over the source/drain structure, annealing the metal layer to react with the source/drain structure, and removing the unreacted metal layer. In addition, an etching solvent may be used to remove the unreacted metal layer without damaging the source/drain structure.

Figures 1, 1A, 2:
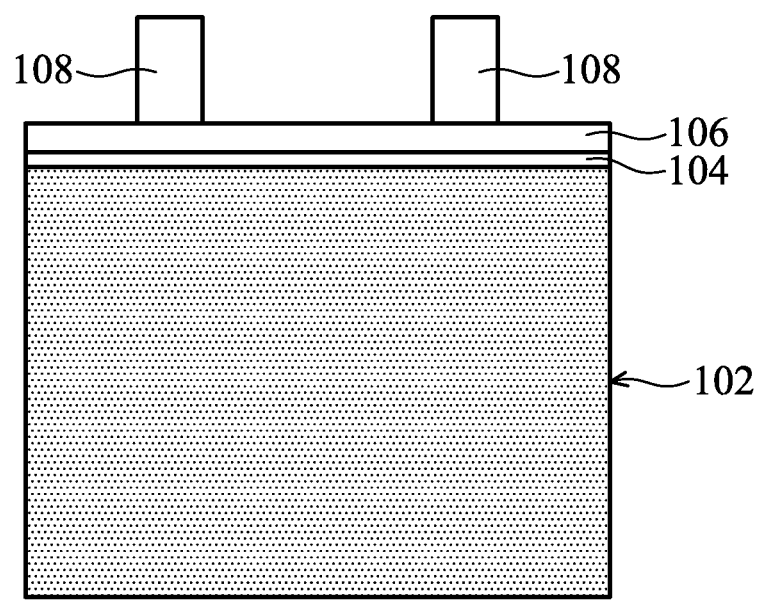
Figures 1, 1B:
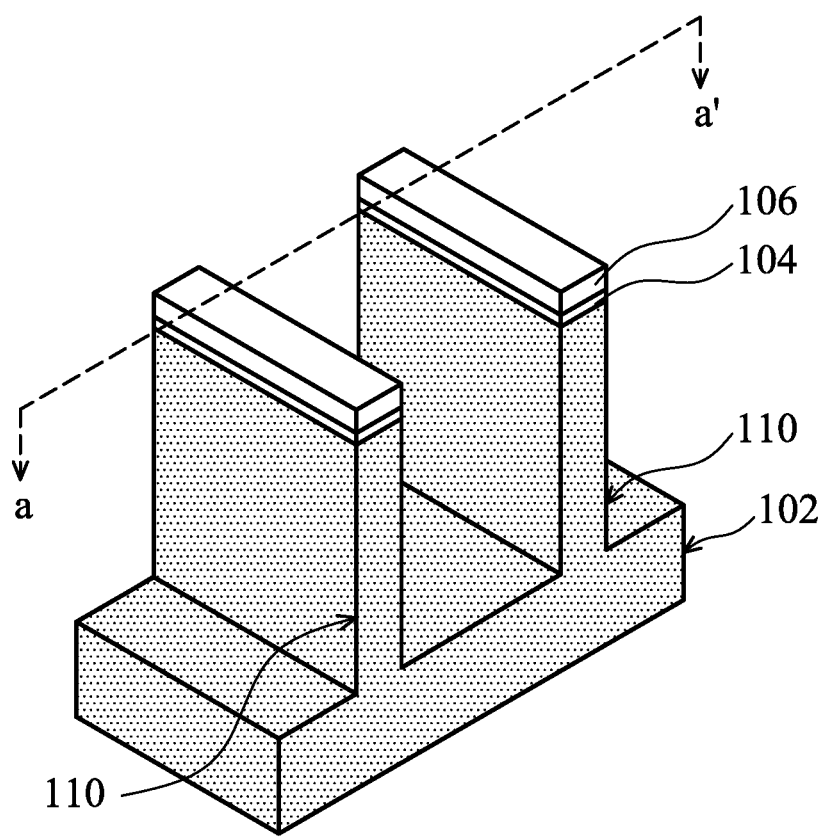
Figures 1, 1B, 2:
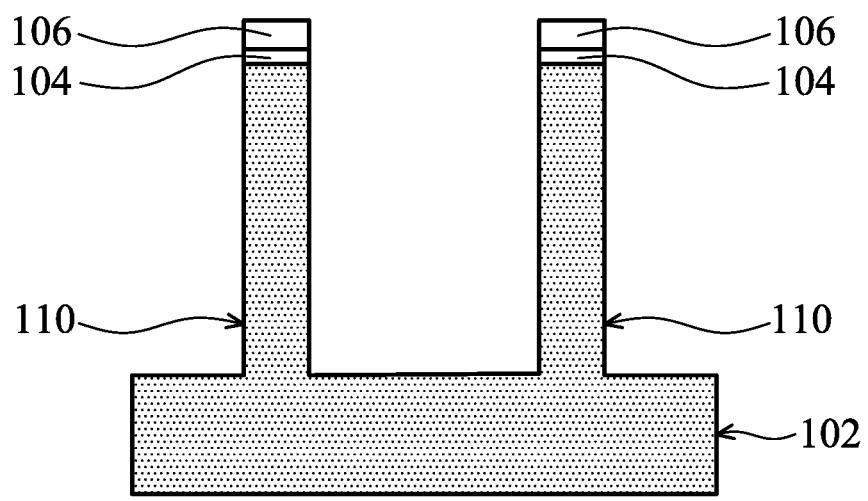
Figures 1, 1C:
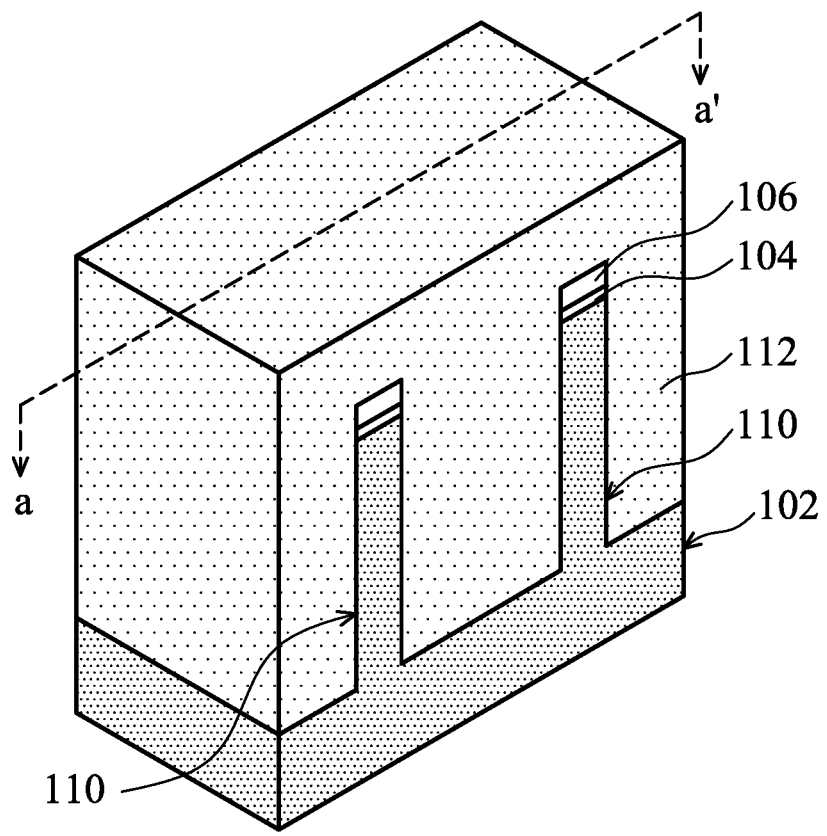
Figures 1, 1C, 2:
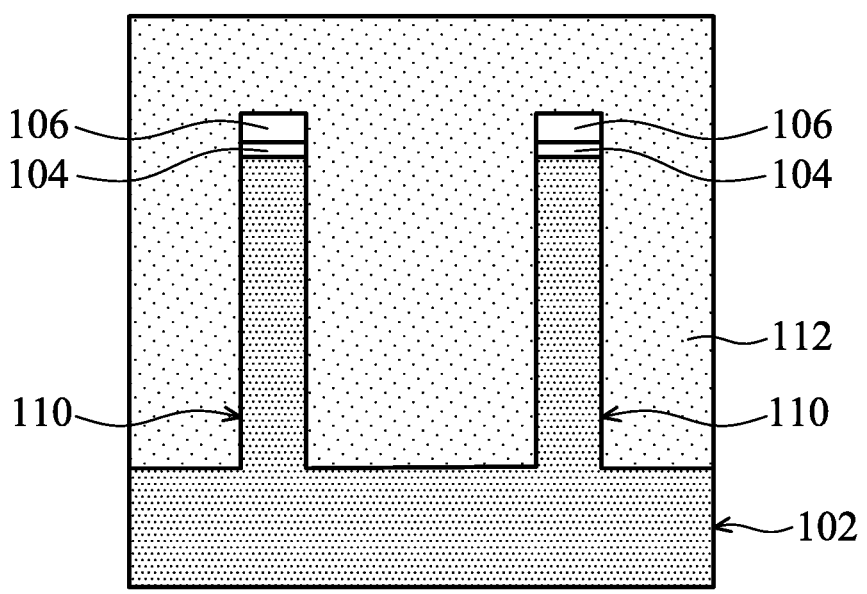
Figures 1, 1D:
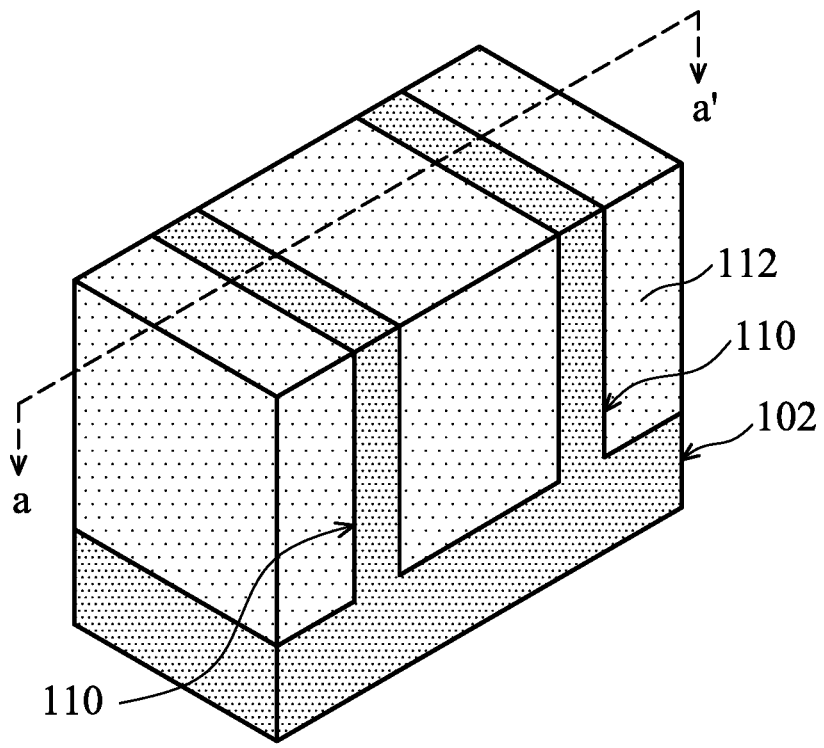
Figures 1, 1D, 2:
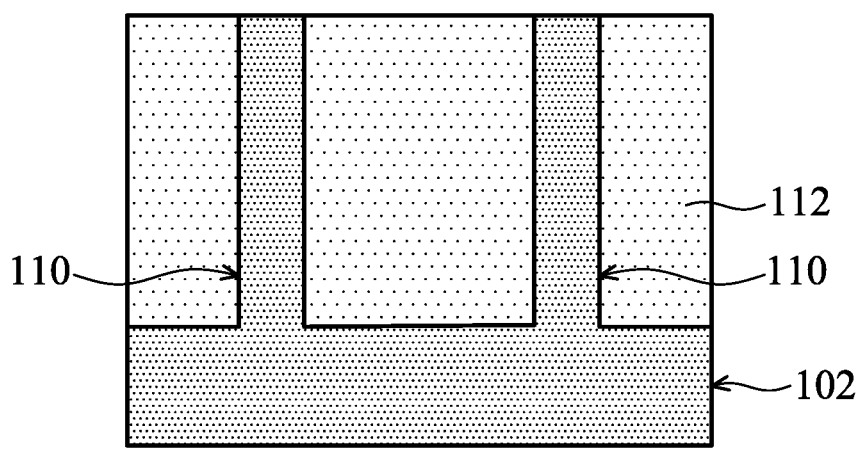
Figures 1, 1E:
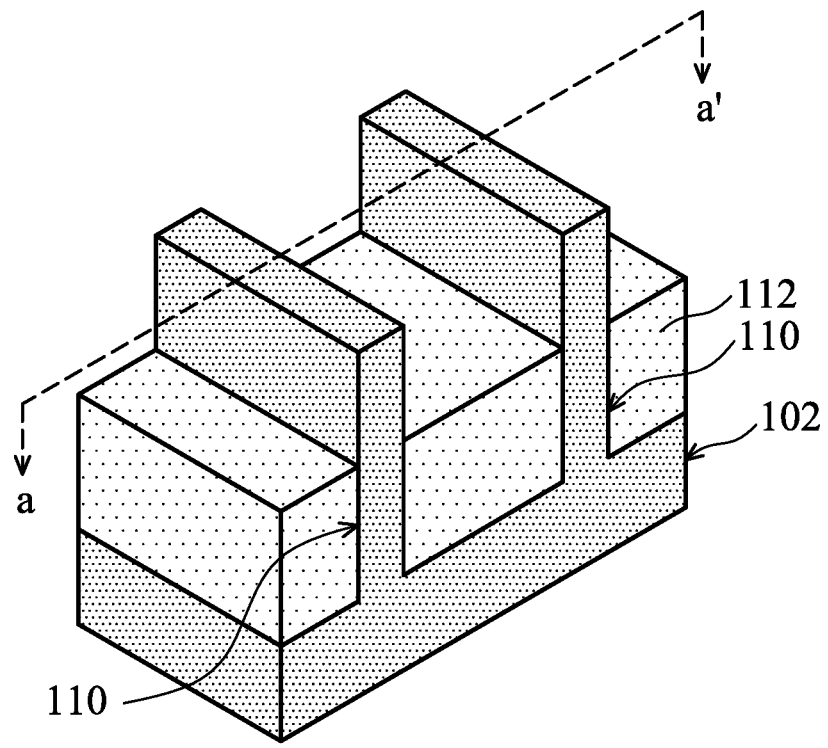
Figures 1, 1E, 2:
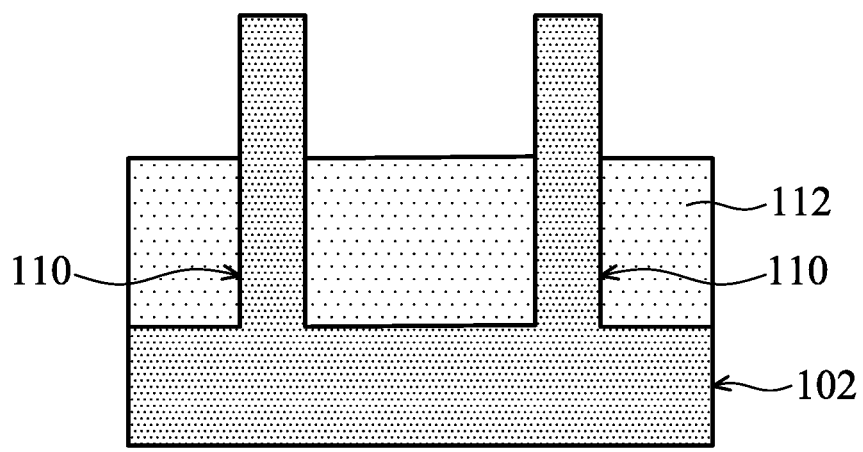
Figures 1, 1F:
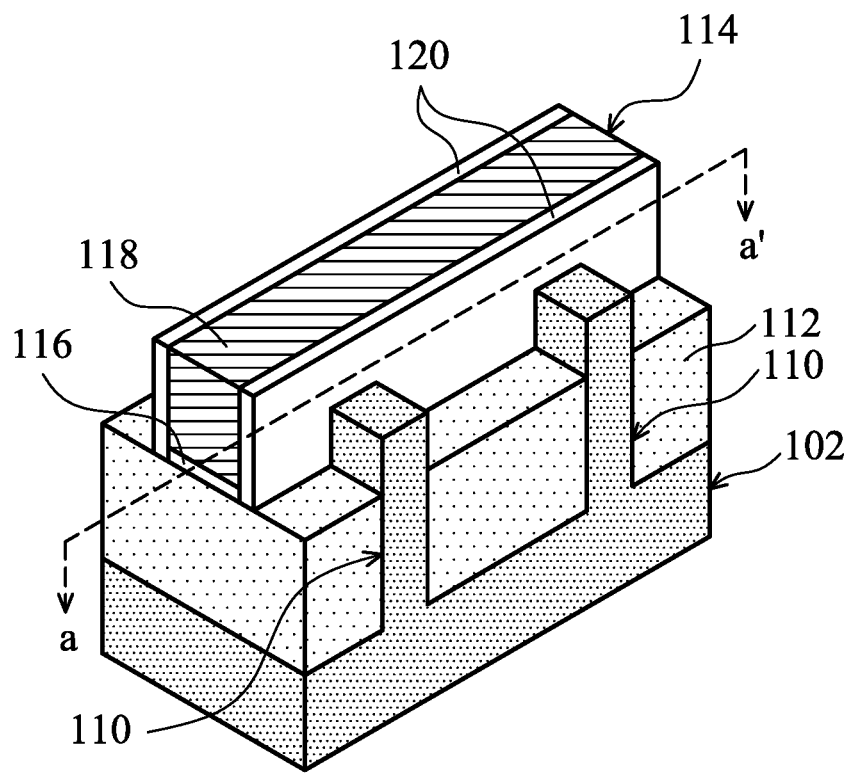
Figures 1, 1F, 2:
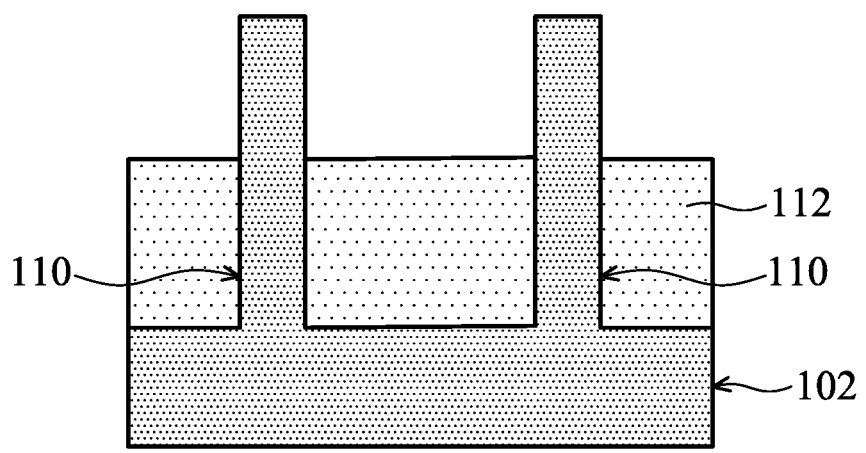
Figures 1, 1G:
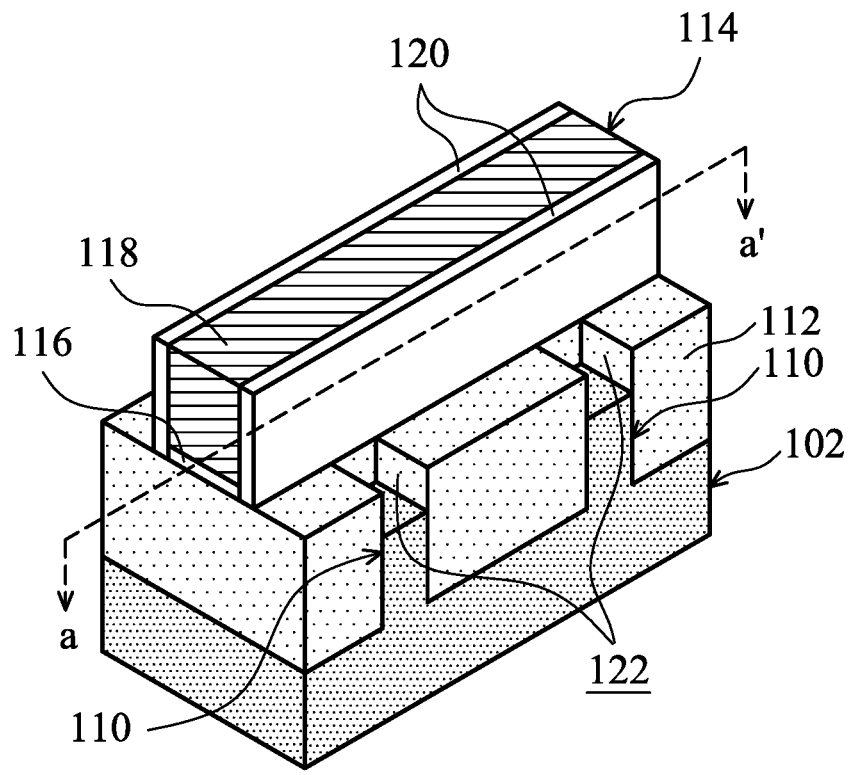
Figures 1, 1G, 2:
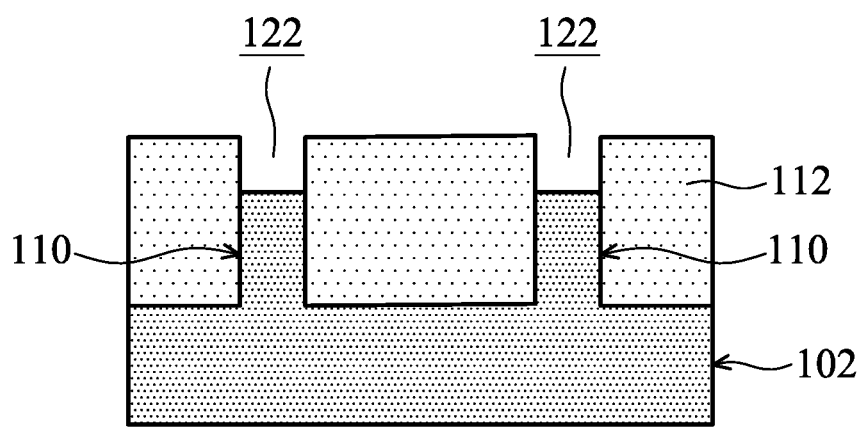
Figures 1, 1H:
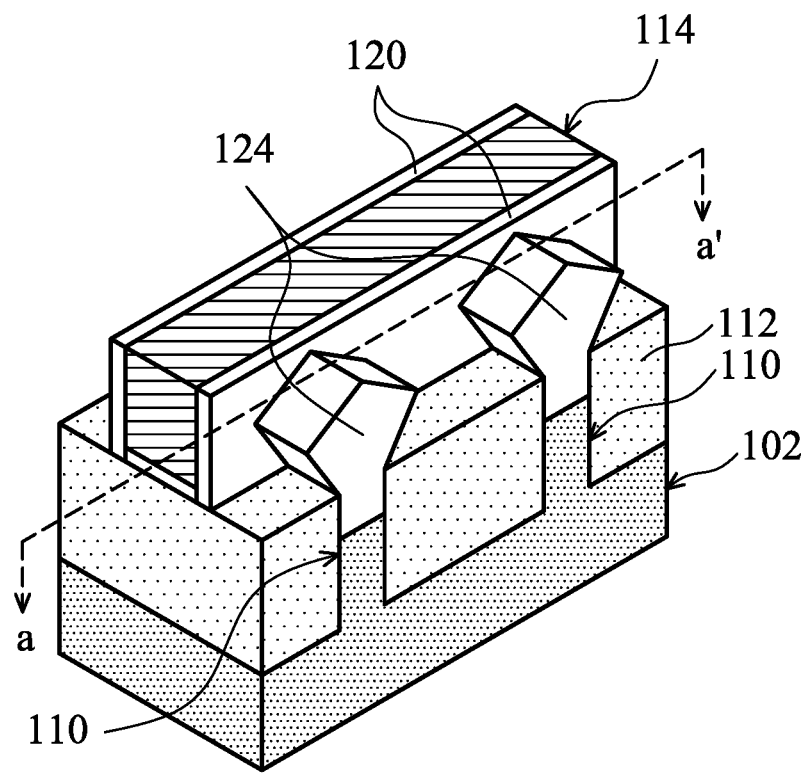
Figures 1, 1H, 2:
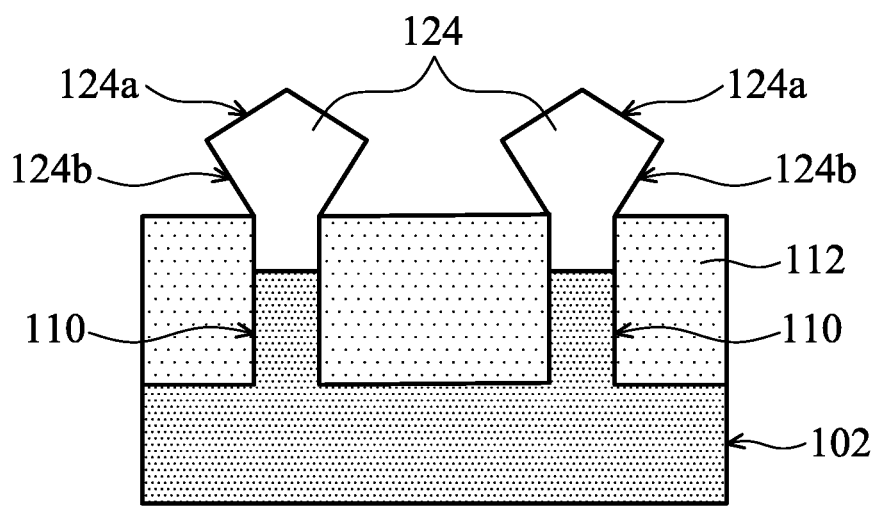
Figure 1I:
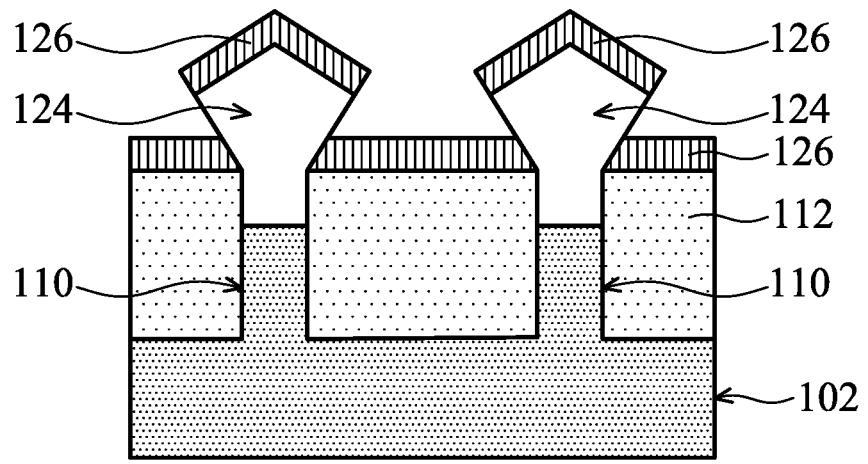
Figure 1J:
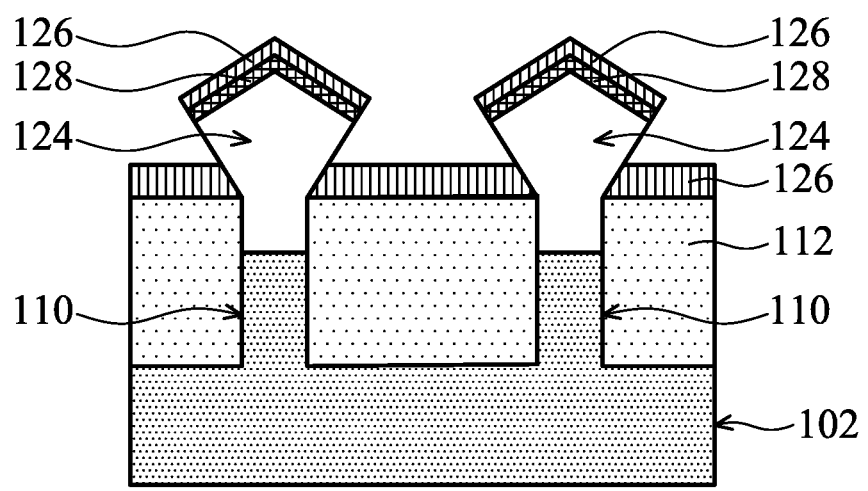
Figure 1K:
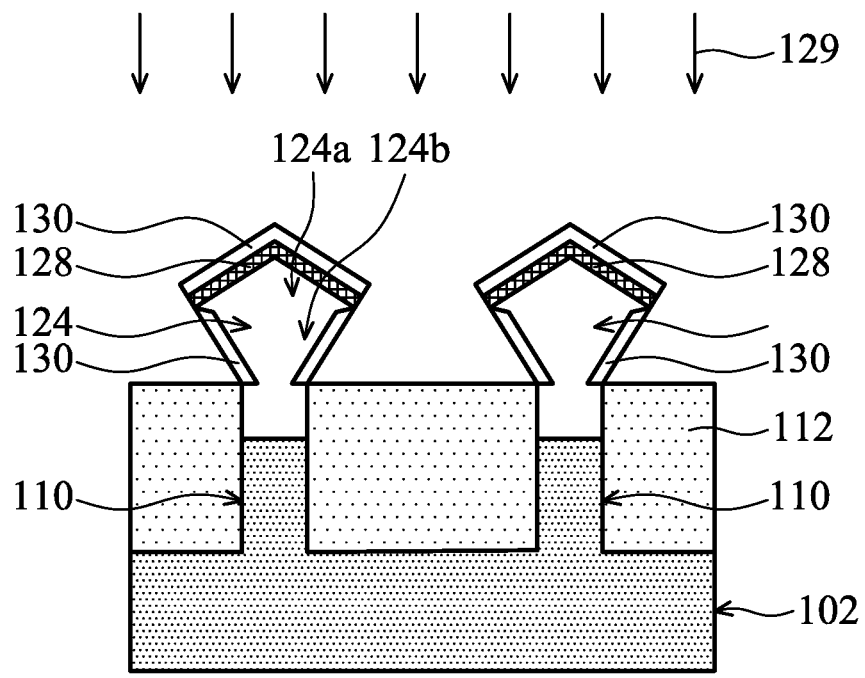
Figure 1L:
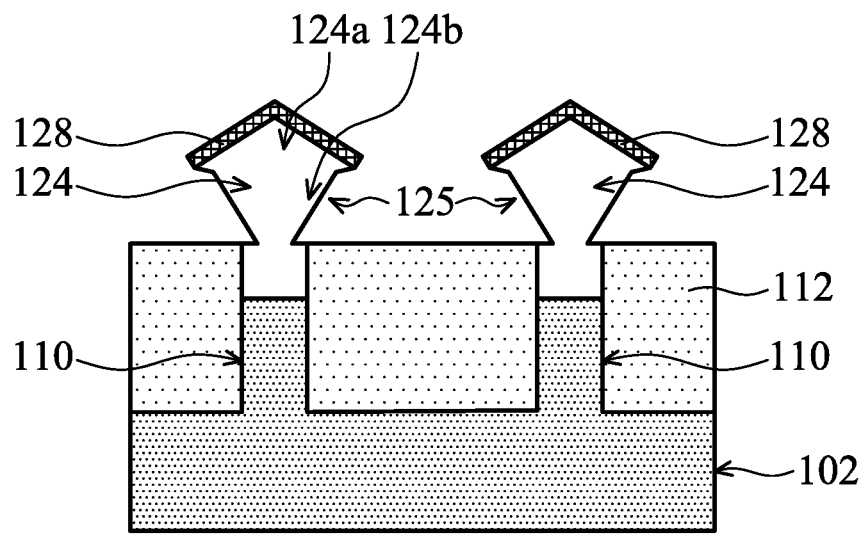
Figure 1M:
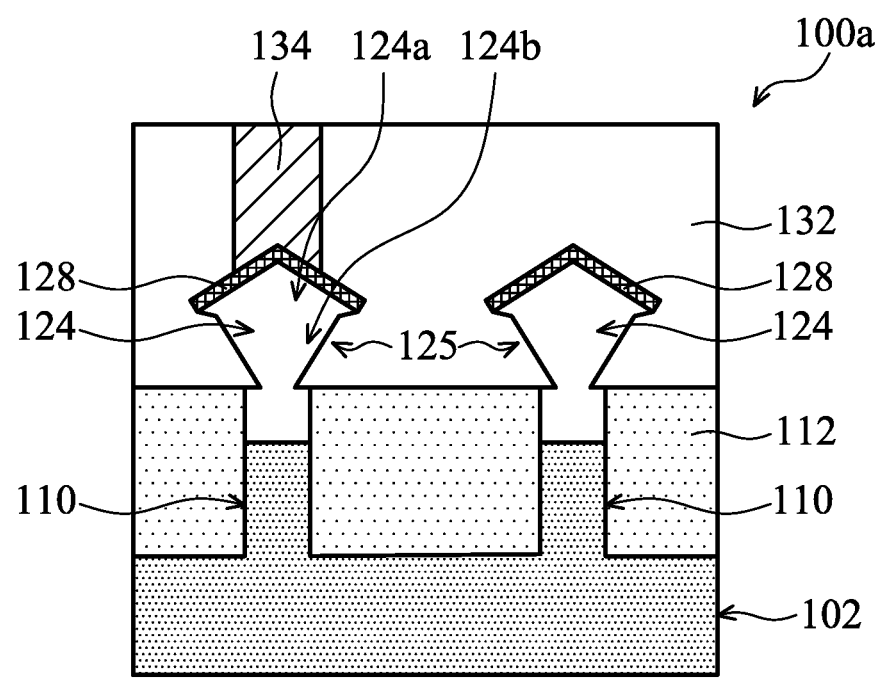

FIGS. 1A-1 to 1M are perspective and cross-sectional representations of various stages of forming a semiconductor structure 100a in accordance with some embodiments. More specifically, FIG. 1A is a perspective representation of semiconductor structure 100a at one of the various stages of fabrication, and FIG. 1A-2 is a cross-sectional representation of semiconductor structure 100a taken along line a-a' of FIG. 1A-1 in accordance with some embodiments.

As shown in FIGS. 1A-1 and 1A-2, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A dielectric layer 104 and a mask layer 106 are formed over substrate 102, and a photo-sensitive layer 108 is formed over mask layer 104, as shown in FIGS. 1A-1 and 1A-2 in accordance with some embodiments. Dielectric layer 104 may be used as an adhesion layer between substrate 102 and mask layer 106. In addition, dielectric layer 104 may also be used as an etch stop layer for etching mask layer 106. In some embodiments, dielectric layer 104 is made of silicon oxide. Dielectric layer 104 may be formed by using a thermal oxidation process, although other deposition processes may be used in some other embodiments.

Mask layer 106 may be used as a hard mask during subsequent photolithography processes. In some embodiments, mask layer 106 is made of silicon nitride. Mask layer 106 may be formed by using low-pressure chemical vapor deposition (LPCVD) or plasma enhanced chemical vapor deposition (PECVD), although other deposition processes may also be used in some other embodiments.

Next, fin structures 110 are formed by sequentially etching mask layer 106, dielectric layer 104, and substrate 102 through photo-sensitive layer 108, as shown in FIGS. 1B-1 and 1B-2 in accordance with some embodiments. Afterwards, photo-sensitive layer 108 is removed.

After photo-sensitive layer 108 is removed, an insulating layer 112 is formed to cover fin structures 110 over substrate 102, as shown in FIGS. 1C-1 and 1C-2 in accordance with some embodiments. In some embodiments, insulating layer 112 is made of silicon oxide, silicon nitride, silicon oxynitride, fluoride-doped silicate glass (FSG), or other low-K dielectric materials. Insulating layer 112 may be formed by using a high-density-plasma (HDP) CVD process, although other deposition processes may be used in other embodiments.

After insulating layer 112 is formed, a chemical mechanical polishing (CMP) process is performed to expose the top surfaces of fin structures 110, as shown in FIGS. 1D-1 and 1D-2 in accordance with some embodiments. As shown in FIG. 1D-1, mask layer 106 and dielectric layer 104 are removed.

Next, insulating layer 112 is recessed to expose the top portion of fin structures 110, as shown in FIGS. 1E-1 and 1E-2 in accordance with some embodiments. Insulating layer 112 may be recessed by a wet etching process or a dry etching process.

Afterwards, a gate structure 114 is formed over fin structures 110, as shown in FIGS. 1F-1 and 1F-2 in accordance with some embodiments. As shown in FIG. 1F-1, gate structure 114 is formed across fin structures 110 and extends over insulating layer 112. In some embodiments, gate structure 114 includes a gate dielectric layer 116 and a gate electrode layer 118.

In some embodiments, gate dielectric layer 116 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials.

Gate electrode layer 118 is formed over gate dielectric layer 116. Gate electrode layer 118 may include a single layer or multilayer structure. In some embodiments, gate electrode layer 118 is made of polysilicon. In some embodiments, gate electrode layer 118 includes a work function metal layer and a metal gate electrode layer. The work function metal layer may be tuned to have a proper work function. For example, if a P-type work function metal (P-metal) for a PMOS device is desired, P-type work function materials may be used. Examples of P-type work function materials include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other applicable materials.

On the other hand, if an N-type work function metal (N-metal) for NMOS devices is desired, N-type metal materials may be used. Examples of N-type work function materials include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other applicable materials.

The metal gate electrode layer may be formed over the work function metal layer and may be made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

Gate structure 114 may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

A sealing layer 120 is formed on sidewalls of gate structure 114, as shown in FIG. 1F-1 in accordance with some embodiments. Sealing layer 120 may protect gate structure 114 from damage or loss during subsequent processing and may also prevent oxidation during subsequent processing. In some embodiments, sealing layer 120 is made of silicon nitride, silicon oxide, silicon oxynitride, silicon carbide, or other applicable dielectric materials. Sealing layer 120 may include a single layer or multiple layers.

After gate structure 114 is formed, portions of fin structures 110 adjacent to gate structure 114 are etched to form recesses 122, as shown in FIGS. 1G-1 and 1G-2 in accordance with some embodiments. As shown in FIG. 1G-1, gate structure 114 and seal layer 120 are used as hard masks when fin structures 110 are etched. Accordingly, recesses 122 are formed in the portions of fin structures 110 adjacent to gate structure 114.

After recesses 122 are formed, source/drain structures 124 are formed in recesses 122 of fin structures 110 over substrate 102, as shown in FIGS. 1H-1 and 1H-2 in accordance with some embodiments. In some embodiments, source/drain structures 124 are raised source/drain structures having diamond shaped structures over substrate 102. As show in FIG. 1H-2, source/drain structure 124 has a top portion 124a and a bottom portion 124b over substrate 102 in accordance with some embodiments.

In some embodiments, source/drain structures 124 are formed by growing a strained material in recesses 122 of fin structure 110 by an epitaxial (epi) process. In addition, the lattice constant of the strained material may be different from the lattice constant of substrate 102. In some embodiments, source/drain structures 124 include Ge, SiGe, InAs, InGaAs, InSb, GaAs, GaSb, InAlP, InP, or a combination thereof.

After source/drain structures 124 are formed, a metal layer 126 is formed to cover source/drain structures 124, as shown in FIG. 1I in accordance with some embodiments. As shown in FIG. 1I, metal layer 126 is formed over top portion 124a of source/drain structures 124. In some embodiments, metal layer 126 is made of Ni, Ti, Al, Sn, Co, Pd, or Pt. Metal layer 126 may be formed by any applicable deposition processes.

After metal layer 126 is formed over top portion 124a of source/drain structure 124, an annealing process is performed to form metallic layer 128, as shown in FIG. 1J in accordance with some embodiments. More specifically, during the annealing process, a portion of metal layer 126 reacts with top portion 124a of source/drain structure 124, such that metallic layer 128 is formed over source/drain structure 124. That is, metallic layer 128 is formed by reacting the material of metal layer 126 and the material of source/drain structure 124. Accordingly, when top portion 124a of source/drain structure 124 is made of Ge and metal layer 126 is made of Ni, the resulting metallic layer 128 will be made of NiGe. Example materials of metallic layer 128 include, but are not limited to, NiGe, NiSiGe, CoInAs, TiInGaAs, TiGe, $Ni_2Ge$, $NiGe_2$, $TiGe_2$, $Ti_2Ge$, NiInAs, TiInAs, $Ni_2InAs$, $Ti_2InAs$, $Co_2InAs$, NiGaAs, $Ni_2GaAs$, TiGaAs, CoGaAs, or the like.

After metallic layer 128 is formed, an etching process 129 is performed to remove the unreacted portion of metal layer 126, as shown in FIG. 1K in accordance with some embodiments. In some embodiments, the etching process is performed at a temperature in a range from about 20° C. to about 150° C. In some embodiments, etching process 129 includes using an etching solvent.

In some embodiments, the etching solvent used in etching process 129 includes (a) a first component, including $H_2SO_4$, HCl, HF, $H_3PO_4$, or $NH_4OH$; and (b) a second component, including propylene carbonate (PC), ethylene carbonate (EC), diethyl carbonate (DEC), acetonitrile, or a combination thereof. In some embodiments, the etching solvent includes $H_2SO_4$ and propylene carbonate. The etching solvent has good selectivity toward the unreacted metal layer 126 and metallic layer 128 and source/drain structure 124. That is, by using the etching solvent, the unreacted metal layer 126 can be removed but metallic layer 128 and source/drain structure 124 will not be removed. In addition, the etching solvent is safe and green (e.g. ecofriendly) and can be obtained easily.

In some embodiments, the volume ratio of the first component to the second component in the etching solvent is in a range from about 0.05:100 to about 1:10. In some embodiments, the etching solvent used in etching process 129 includes 0.05 (vol) % to 10 (vol) % of the first component and 90 (vol) % to 99.5 (vol) % of the second component. If the etching solvent contains too much of the first component, selectivity during etching process 129 may be worse and source/drain structure may be corroded during etching process 129. On the other hand, if the etching solvent contains too little of the first component, Ni etching rate will decrease with less of the first component.

In some embodiments, the etching solvent used in etching process 129 includes (a) a first component, including $H_2SO_4$, HCl, HF, $H_3PO_4$, or $NH_4OH$; (b) a second component, including propylene carbonate (PC), ethylene carbonate (EC), diethyl carbonate (DEC), acetonitrile, or a combination thereof; and (c) a third component, including $H_2O_2$ or ozone.

As described above, the etching solvent has good selectivity toward the unreacted metal layer 126 and metallic layer 128 and source/drain structure 124. In addition, when the etching solvent further includes the third component, such as $H_2O_2$, an oxide film 130 is formed on the sidewalls of source/drain structure 124, as shown in FIG. 1K in accordance with some embodiments. In some embodiments, the thickness of oxide film 130 is in a range from about 0.2 nm to about 2 nm. In addition, oxide film 130 is also formed over metallic layer 128 after unreacted metal layer 124 is removed in accordance with some embodiments.

In some embodiments, the volume ratio of the first component to the third component in the etching solvent is in a range from about 0.05:0.0001 to about 1:0.1. In some embodiments, the volume ratio of the first component to the second component to the third component in the etching solvent is in a range from about 0.05:100:0.0001 to about 1:10:0.1. In some embodiments, the etching solvent includes 0.05 (vol) % to 1 (vol) % of the first component, 89 (vol) % to 99.9499 (vol) % of the second component, and 0.0001 (vol) % to 0.1 (vol) % of the third component.

If the etching solvent contains too much of the third component, the etching selectivity toward metal layer 126 and metallic layer 128 become worse. On the other hand, if the etching solvent contains too little of the third component, oxide layer 130 may only formed on some surfaces of source/drain structure 124 but not on all exposed surface of source/drain structure 124, and therefore the risks of source/drain structure corrosion may increase.

In the embodiments in which oxide film 130 is formed over metallic layer 128, a cleaning process is performed to remove oxide film 130 formed over metallic layer 128, as shown in FIG. 1L in accordance with some embodiments. In some embodiments, the cleaning process is an Ar splittering process. In some embodiments, the cleaning process is a wet etching process. As shown in FIG. 1L, both oxide film 130 formed over metallic layer 128 and oxide film 130 formed on the sidewalls of bottom portion 124b of source/drain structure 124 are removed by the cleaning process in accordance with some embodiments. As shown in FIG. 1L, a dent 125 is formed at the sidewall of bottom portion 124b of source/drain structure 124 after oxide film 130 is removed.

However, it should be noted that in some other embodiments, oxide film 130 formed over metallic layer 128 is removed by the cleaning process but oxide film 130 formed on the sidewalls of bottom portion 124b of source/drain structure 124 is not removed. In these case, oxide film 130 is left in dent 125 of source/drain structure 124.

Next, an inter-layer dielectric (ILD) layer 132 is formed to cover source/drain structure 124 over substrate 102, as shown in FIG. 1M in accordance with some embodiments. Inter-layer dielectric layer 132 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

Inter-layer dielectric layer 132 may be formed by chemical vapor deposition (CVD), physical vapor deposition, (PVD), atomic layer deposition (ALD), spin-on coating, or other applicable processes.

After inter-layer dielectric (ILD) layer 132 is formed, a contact 134 is formed through inter-layer dielectric layer 132, as shown in FIG. 1M in accordance with some embodiments. Contact 134 may be formed by forming a contact trench in inter-layer dielectric layer 132 over source/drain structure 124 and filling the contact trench by a conductive material.

In some embodiments, the conductive material used to make contact 132 includes aluminum (Al), copper (Cu), tungsten (W), titanium (Ti), tantalum (Ta), titanium nitride (TiN), tantalum nitride (TaN), nickel silicide (NiS), cobalt silicide (CoSi), tantalum carbide (TaC), tantalum silicide nitride (TaSiN), tantalum carbide nitride (TaCN), titanium aluminide (TiAl), titanium aluminide nitride (TiAlN), other applicable conductive materials, or a combination thereof. In some embodiments, contact 134 includes a titanium nitride layer and tungsten formed over the titanium nitride layer.

In addition, contact 134 may further include a liner and/or a barrier layer. For example, a liner (not shown) may be formed on the sidewalls and bottom of the contact trench. The liner may be either tetraethylorthosilicate (TEOS) or silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

FIGS. 2A to 2F are cross-sectional representations of various stages of forming a semiconductor structure 100b in accordance with some embodiments. Methods and materials used to form semiconductor structure 100b are similar to, or the same as, those used to form semiconductor structure 100a shown in FIGS. 1A-1 to FIG. 1M, and the same or similar methods and materials are not repeated herein.

More specifically, the methods and materials shown in FIGS. 1A-1 to 1H-2 and described previously may also be used to form semiconductor structure 100b. However, after source/drain structure 124 is formed (as shown in FIG. 1H-2) but before metal layer 126 is formed, inter-layer dielectric layer 132 is formed to cover source/drain structure 124 over substrate 102, as shown in FIG. 2A in accordance with some embodiments.

Figure 2A:
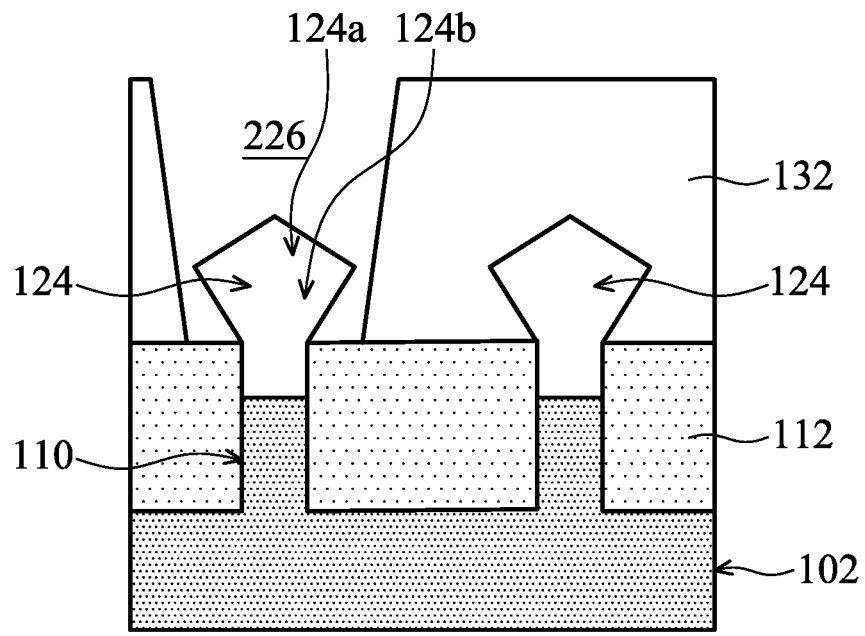
FIGS. 2A to 2F are cross-sectional representations of various stages of forming a semiconductor structure in accordance with some embodiments.

In addition, a contact trench 226 is formed in inter-layer dielectric layer 132 over source/drain structure 124, such that source/drain structure 124 is exposed by contact trench 226, as shown in FIG. 2A in accordance with some embodiments. Contact trench 226 may be formed by an etching process.

Figure 2B:
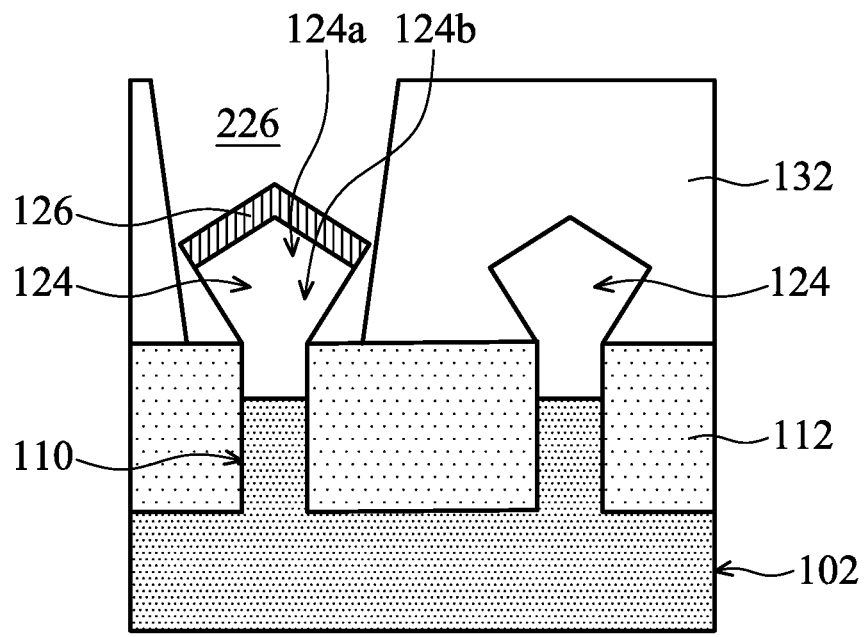

After contact trench 226 is formed to expose source/drain structure 124, metal layer 126 is formed over source/drain structure 124, as shown in FIG. 2B in accordance with some embodiments. In some embodiments, metal layer 126 is formed by depositing a metal material in contact trench 226, and therefore metal layer 126 is formed over top portion 124a of source/drain structure 124 but not over the portion of insulating layer 112 below source/drain structure 124.

Figure 2C:
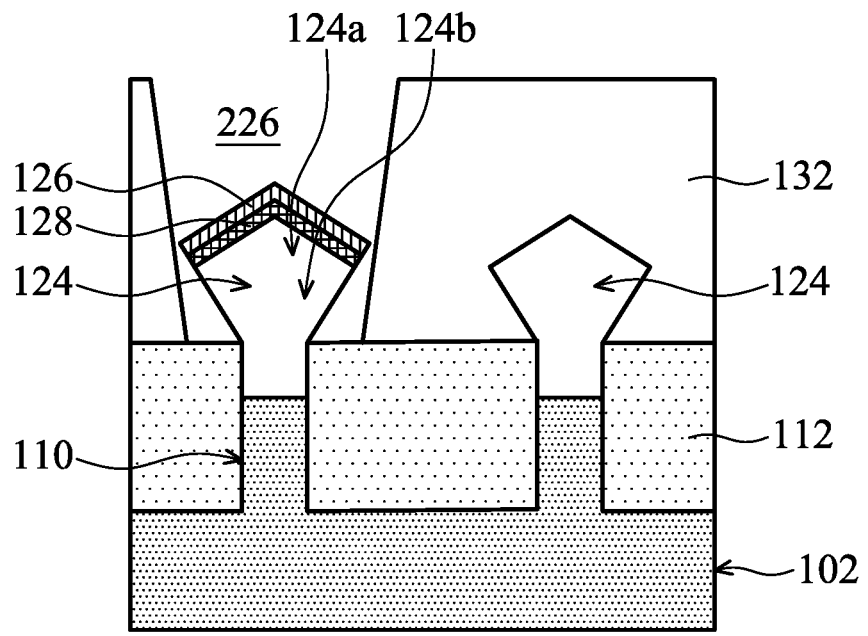

After metal layer 126 is formed over source/drain structure 124, processes similar to those shown in FIGS. 1J to 1L and described previously are performed. More specifically, the annealing process is performed to form metallic layer 128, as shown in FIG. 2C in accordance with some embodiments.

Figure 2D:
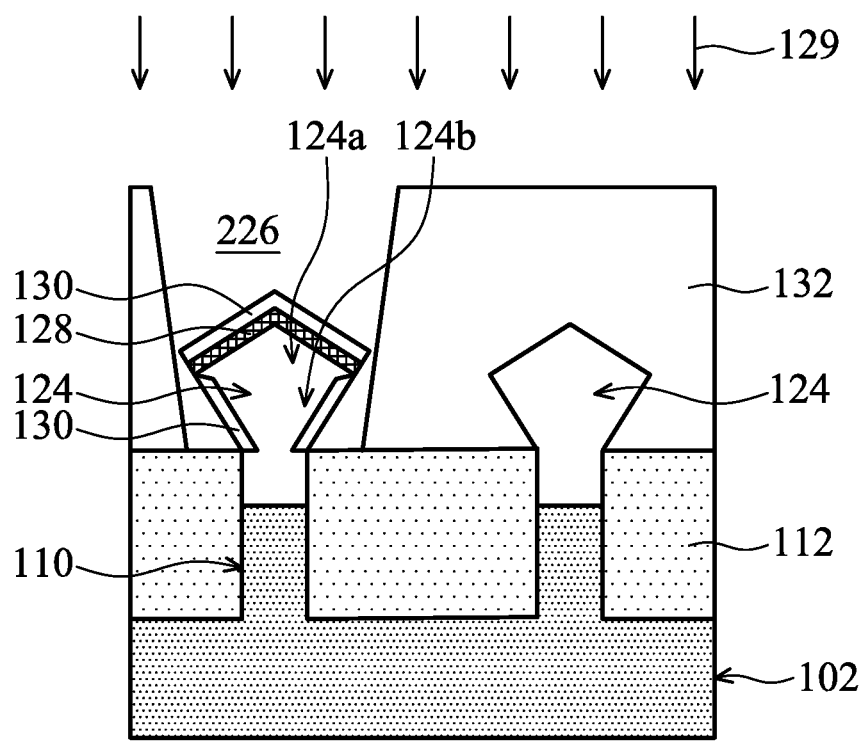

After metallic layer 128 is formed, etching process 129 is performed to remove the unreacted portion of metal layer 126, as shown in FIG. 2D in accordance with some embodiments. As described previously, etching process 129 includes using an etching solvent including the first component, such as $H_2SO_4$, the second component, such as propylene carbonate, and the third component, such as $H_2O_2$ in accordance with some embodiments. When the etching solvent includes the third component, oxide film 130 is formed on the sidewalls of source/drain structure 124 and over metallic layer 128, as shown in FIG. 2D in accordance with some embodiments.

Figure 2E:
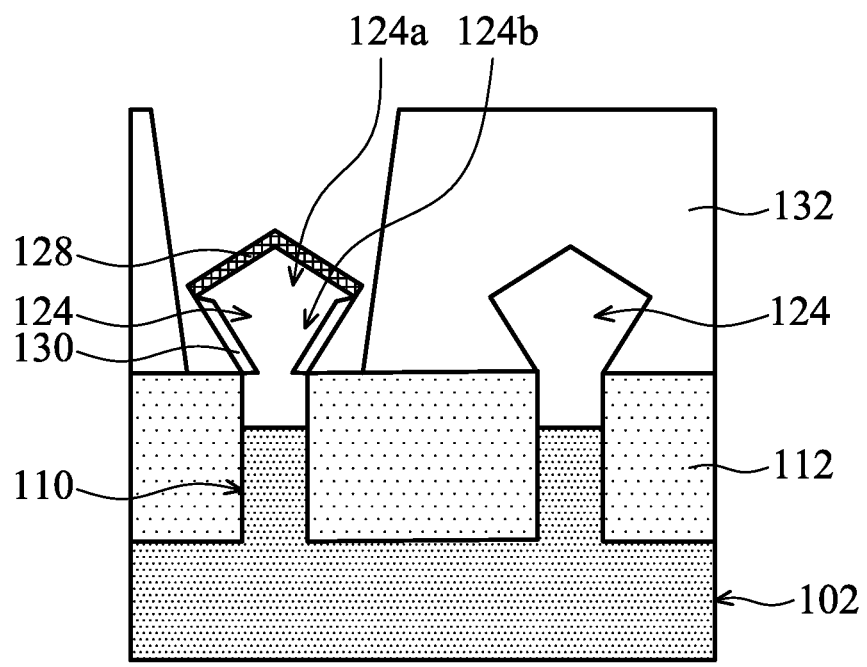

In the embodiments that oxide film 130 is formed over metallic layer 128, the cleaning process is performed to remove oxide film 130 formed over metallic layer 128, as shown in FIG. 2E in accordance with some embodiments. In some embodiments, the cleaning process is an Ar sputtering process. As shown in FIG. 2E, although oxide film 130 formed over metallic layer 128 is removed by the cleaning process, oxide film 130 formed on the sidewalls of bottom portion 124b of source/drain structure 124 is not removed by the cleaning process in accordance with some embodiments.

Figure 2F:
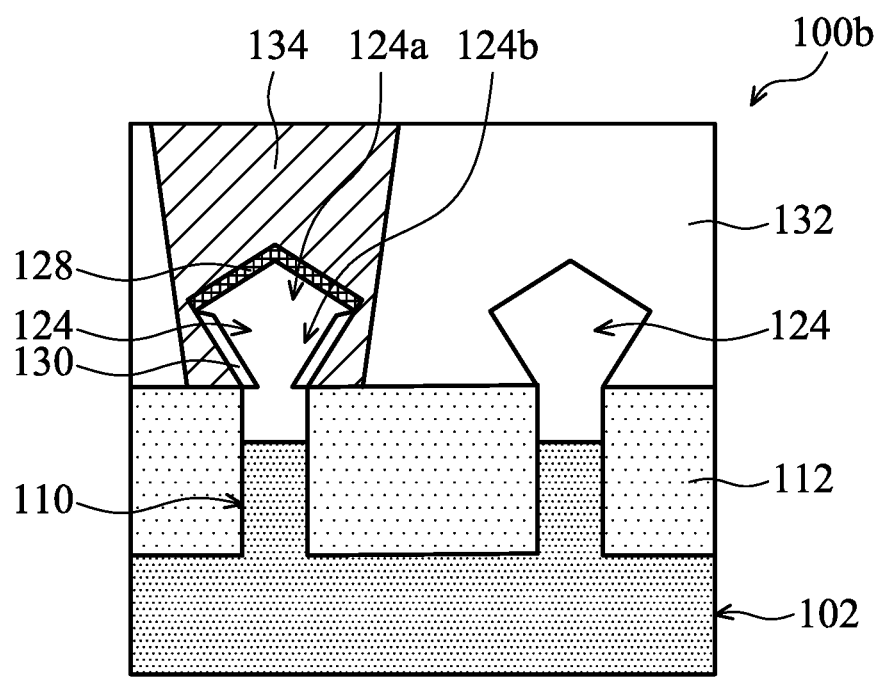

After oxide film 130 formed over metallic layer 128 is removed, the conductive material is used to fill in contact trench 226, such that contact 134 is formed in contact trench 226, as shown in FIG. 2F in accordance with some embodiments. As shown in FIG. 2F, contact 134 is in direct contact with oxide film 130 formed on the sidewalls of bottom portion 124b of source/drain structure 124 in accordance with some embodiments.

Figure 3:
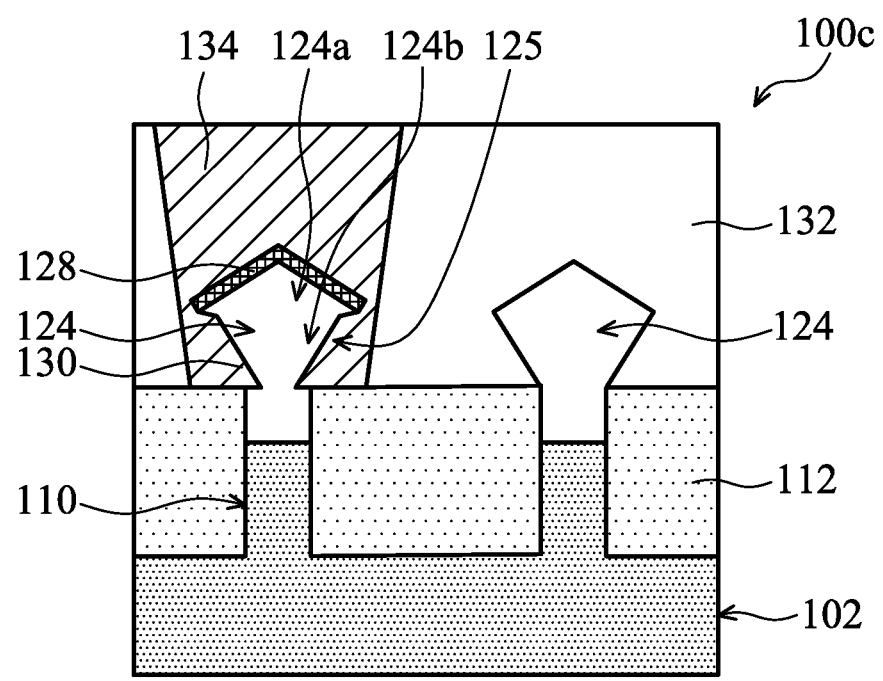
FIG. 3 is a cross-sectional representation of a semiconductor structure in accordance with some embodiments.

FIG. 3 is a cross-sectional representation of a semiconductor structure 100c in accordance with some embodiments. Semiconductor structure 100c is similar to semiconductor structure 100b shown in FIG. 2F except oxide film 130 formed on the sidewalls of bottom portion 124b of source/drain structure 124 is removed.

More specifically, the methods and materials shown in FIGS. 2A to 2D and described previously may also be used to form semiconductor structure 100c. However, after etching process 129 is performed, the cleaning process is performed to remove both oxide film 130 formed over metallic layer 128 and oxide film 130 formed on the sidewalls of bottom portion 124b of source/drain structure 124. In some embodiments, the cleaning process is a wet etching process.

As shown in FIG. 3, in the embodiments that oxide film 130 formed on the sidewalls of bottom portion 124b of source/drain structure 124 is removed, contact 134 is in direct contact with bottom portion 124b of source/drain structure 124. In addition, source/drain structure 124 has dent 125 at bottom portion 124b.

It should be noted that although the semiconductor structures shown in FIGS. 1A-1 to 3 are fin field effect transistors (FinFET), the concept of the disclosure is not intended to be limiting. That is, the method and materials described above, such as etching process 129, may also be used to form planar metal-oxide-semiconductor field effect transistors (planar MOSFET) or nanowire field effect transistors.

Figure 4:
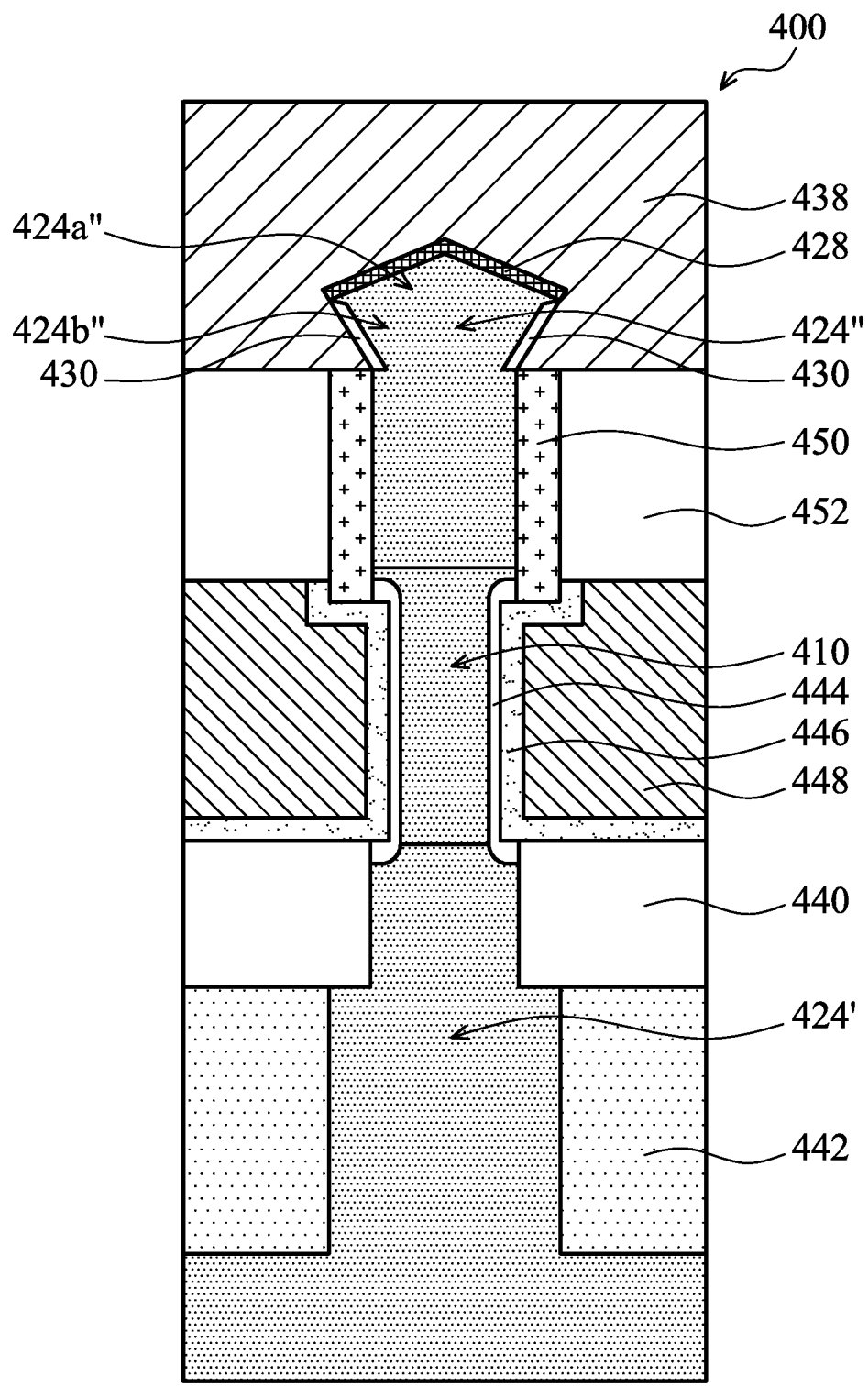
FIG. 4 is a cross-sectional representation of a nanowire field effect transistor structure in accordance with some embodiments.

FIG. 4 is a cross-sectional representation of a nanowire field effect transistor structure 400 in accordance with some embodiments. Nanowire field effect transistor structure 400 includes nanowire structure 410, and nanowire structure 410 includes a source structure 424' and a drain structure 424". In some embodiments, drain structure 424" has a diamond shaped structure similar to source/drain structure 124 shown in FIG. 2F. In some embodiments, source structure 424' and drain structure 424" are raised source/drain structures in nanowire structure 410.

In addition, drain structure 424" has a top portion 424"*a* and a bottom portion 424"*b*. A metallic layer 438 is formed over top portion 424"*a* of drain structure 424" in accordance with some embodiments. Metallic layer 438 may be the same as, or similar to, metallic layer 138 described previously. For example, metallic layer 438 may also be formed by forming a metal layer over drain structure 424", annealing the metal layer, removing the unreacted metal layer by using an etching solvent. The etching solvent used to remove the unreacted metal layer may be the same as that used in etching process 129 described previously.

Furthermore, an oxide film 430 is formed over the sidewalls of bottom portion 424"*b* of drain structure 424" in accordance with some embodiments. Oxide film 430 may be the same as, or similar to, oxide film 130.

After metallic layer 428 is formed, a contact 438 is formed over metallic layer 428 over drain structure 424", as shown in FIG. 4 in accordance with some embodiments. Contact 438 may be the same as, or similar to, contact 138 described previously. In some embodiments, contact 438 is a drain pad.

As shown in FIG. 4, nanowire field effect transistor structure 400 further includes a source spacer 440 and source metallic layer 442, such as silicide, formed adjacent to source structure 424'. Furthermore, a channel region of nanowire structure 410 positioned between source structure 424' and drain structure 424" is surrounded by an inter-layer 444, a high k dielectric layer 446, and a metal gate structure 448. A drain spacer 450 is formed adjacent to drain structure 424", and a gate spacer 452 is formed adjacent to metal gate structure 448.

It should be noted that FIGS. 1A to 4 have been simplified for the sake of clarity to better illustrate the concepts of the present disclosure. Additional features may be added to semiconductor structures 100*a* to 100*c* and nanowire field effect transistor structure 400, and some of the features described below can be replaced or eliminated in other embodiments.

As described previously, etching process 129 is used to removed unreacted metal layer 126, and etching process 126 includes using the etching solvent in accordance with some embodiments. The etching solvent used in etching process 129 has good selectivity toward metal layer 126 (e.g. a Ni layer) and source/drain structure 124 (e.g. a Ge structure). In addition, the etching solvent can inhibit corrosion of source/drain structure 124.

More specifically, if $HCl_{(aq.)}$ is used to remove the unreacted metal layer described above, galvanic corrosion may occur when two dissimilar metal or semiconductor materials, such as Ge/NiGe, or SiGe/NiSiGe, are exposed. However, the etching solvent described previously and used in etching process 129 can inhibit corrosion.

In addition, oxide film 130 is formed in accordance with some embodiments. Oxide film 130 can be seen as a passivation layer for source/drain structure 124. Therefore, additional processes for forming protection layer at bottom portion 124*b* of source/drain structure 124 are not required.

However, an oxide film, such as $GeO_2$ film, tends to be soluble in most acid solutions which may be used as an etching agent. If the oxide film keep dissolving in the acid solution, the source/drain structure will be corroded and damaged. Therefore, the etching solvent used in etching process 129 is aprotic without hydrogen bonding networks, such that oxide film, which is an oxyanion, will have low solubility in the etching solvent. For example, the etching solvent includes a relatively large amount of the second component, such as propylene carbonate (PC), and oxide film 130 will have low solubility therein. In addition, PC may also stabilize the metal ion, such as $Ni^{2+}$, and prevent the formation of decomposition reaction product in the etching solvent.

Furthermore, etching process 129 can be easily implemented in the original manufacturing process without performing complicated processes or using unusual chemicals. Therefore, the cost of the manufacturing may be reduced.

Embodiments for forming a semiconductor structure are provided. The semiconductor structure includes a source/drain structure, a metallic layer formed over the source/drain structure, and a contact formed over the metallic layer. The metallic layer is formed by forming a metal layer over the source/drain structure, annealing the metal layer, and removing the unreacted metal layer. The unreacted metal layer is removed by an etching process using an etching solvent including first component, such as $H_2SO_4$, and a second component, such as propylene carbonate. The etching solvent has good selectivity toward the metal layer and the source/drain structure and can prevent the corrosion of the source/drain structure.

In some embodiments, a method for manufacturing a semiconductor structure is provided. The method for manufacturing a semiconductor structure includes forming a source/drain structure over a substrate and forming a metal layer over the source/drain structure. The method for manufacturing a semiconductor structure further includes reacting a portion of the metal layer with the source/drain structure to form a metallic layer by using an etching solvent. In addition, the etching solvent includes (a) a first component and (b) a second component. The first component includes an acid, and the second component includes propylene carbonate (PC), ethylene carbonate (EC), diethyl carbonate (DEC), or a combination thereof.

In some embodiments, a method for manufacturing a semiconductor structure is provided. The method for manufacturing a semiconductor structure includes forming a fin structure over a substrate and forming a gate structure across the fin structure. The method for manufacturing a semiconductor structure further includes forming a source/drain structure over a substrate and forming a metallic layer over the source/drain structure. The method for manufacturing a semiconductor structure further includes applying a solvent over the metallic layer. In addition, the solvent includes (a) a first component and (b) a second component. The first component includes an acid, and the second component includes propylene carbonate (PC), ethylene carbonate (EC), diethyl carbonate (DEC), or a combination thereof.

In some embodiments, a method for manufacturing a semiconductor structure is provided. The semiconductor structure includes forming a source/drain structure over a substrate and forming a metal layer over the source/drain structure. The method for manufacturing a semiconductor structure further includes reacting a portion of the metal layer with the source/drain structure to form a metallic layer and forming an oxide film on a sidewall of the source/drain structure by using a solvent. In addition, the solvent includes (a) a first component and (b) a second component. The first component includes an acid, and the second component includes propylene carbonate (PC), ethylene carbonate (EC), diethyl carbonate (DEC), or a combination thereof.

Example 1

A blanket wafer made of Si was provided. A Ge layer was formed over the blanket wafer by an epitaxy growing process. After the Ge layer was formed, a Ni layer was deposited on the Ge layer. An annealing process was performed on the Ni layer to form a NiGe layer. After the annealing process, an etching process was performed to remove unreacted Ni layer at 70° C. The etching process included using an etching solvent including $H_2SO_4$, $H_2O_2$, and propylene carbonate at a volume ratio of 100:1:10000.

Figure 5A:
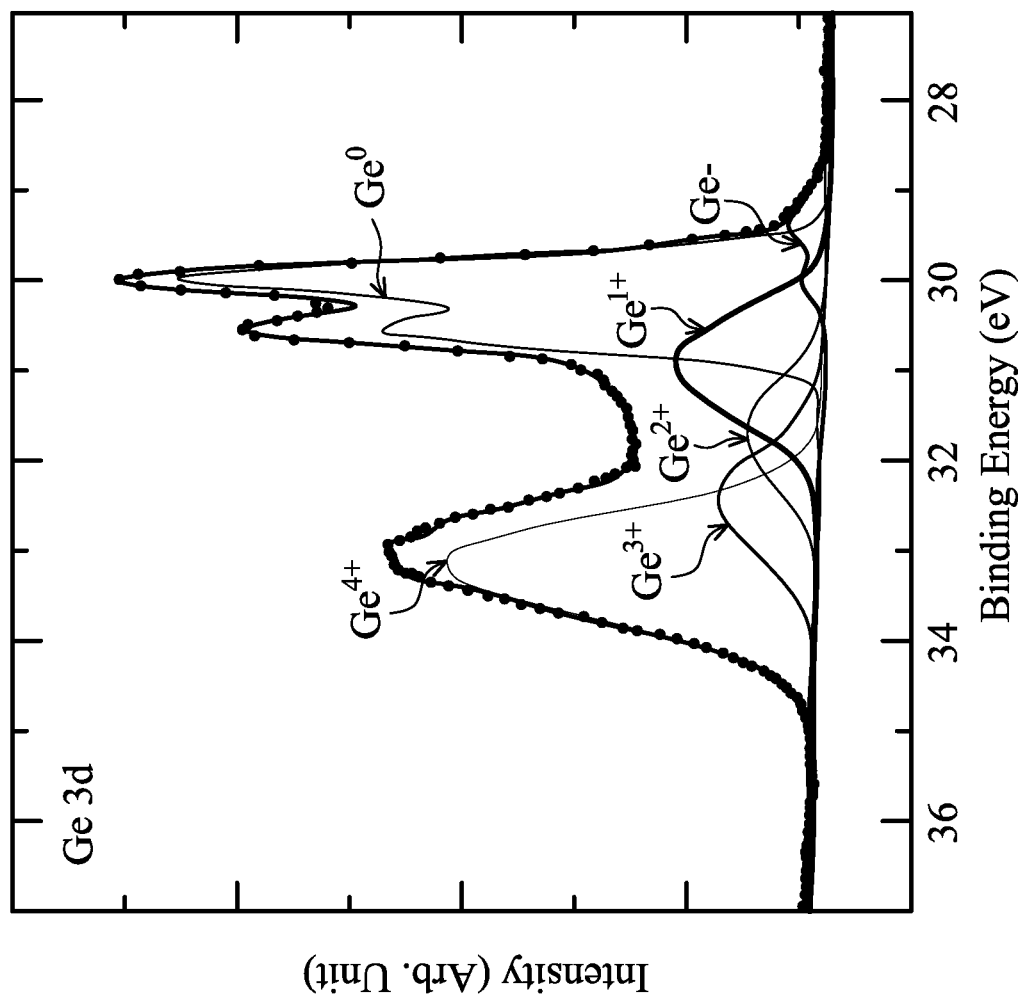
FIGS. 5A to 5C are a synchrotron radiation photo emission spectroscopy (SPRES) in accordance with an example.
Figure 5B:
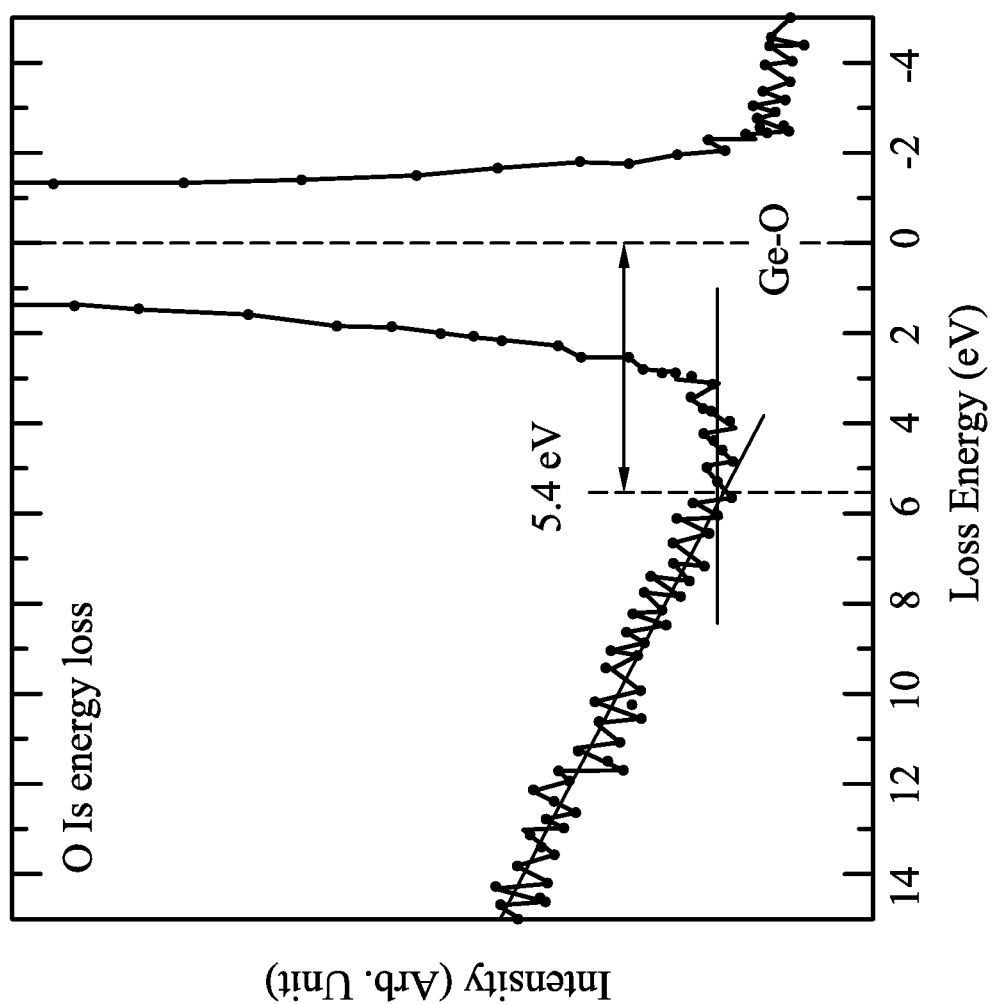
Figure 5C:
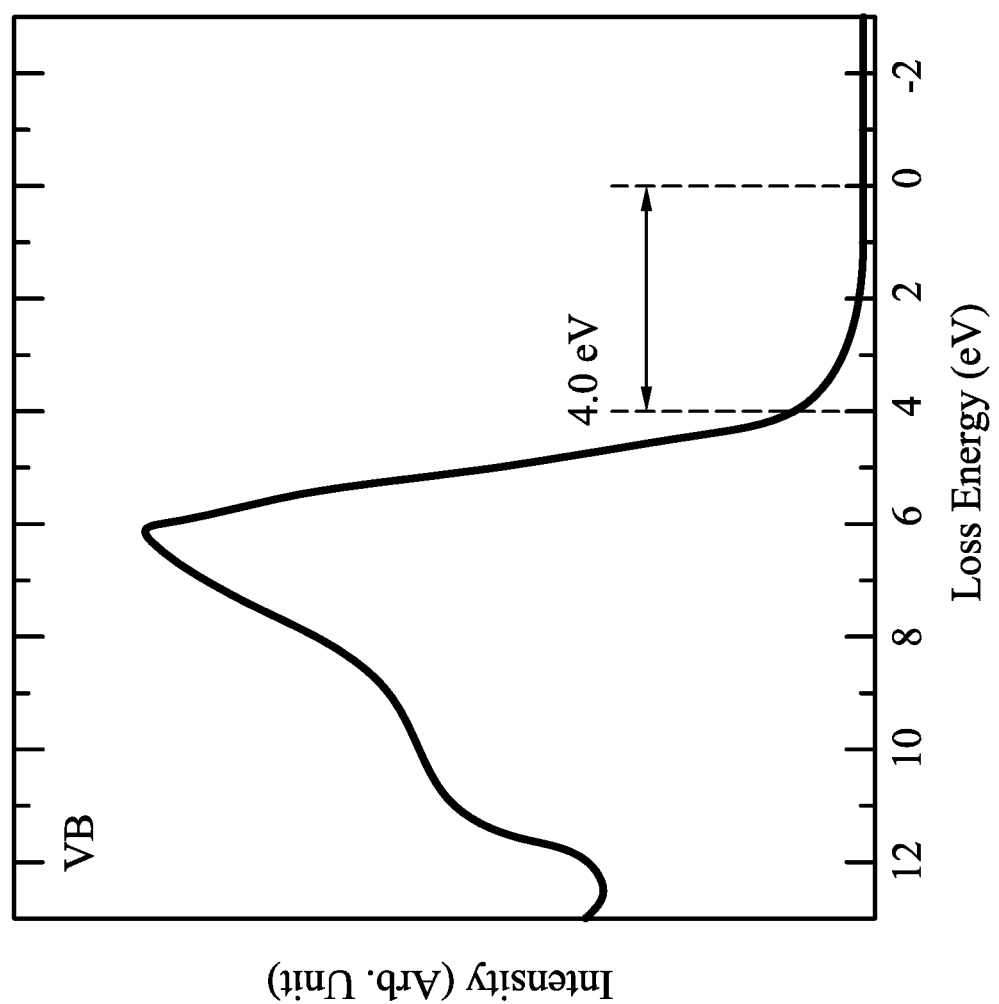

FIGS. 5A to 5C are synchrotron radiation photo emission spectroscopy (SPRES) of the wafer after NiGe layer was formed. More specifically, FIG. 5A shows the binding energy of Ge 3$d$, FIG. 5B shows the energy loss of O 1 s, and FIG. 5C shows valence band (VB) spectra. The $Ge^{4+}$ component in FIG. 5A indicates that $GeO_2$ was successfully formed on the Ge surface. In addition, the bandgap of $GeO_2$ and the valence band offset of $GeO_2$/Ge were 5.4 eV and 4.0 eV respectively, as shown in FIGS. 5B and 5C. That is, unreacted Ni was successfully removed and $GeO_2$ was formed on Ge layer after the etching process.

Comparative Example

A blanket wafer made of Si was provided. A Ge layer was formed over the blanket wafer by an epitaxy growing process. After the Ge layer was formed, a Ni layer was deposited on the Ge layer. An annealing process was performed on the Ni layer to form a NiGe layer. After the annealing process, an etching process was performed to remove unreacted Ni layer at 70° C. The etching process included using an etching solvent including 1% $H_2SO_4$ diluted by $H_2O$.

Example 2

A blanket wafer made of Si was provided. A Ge layer was formed over the blanket wafer by an epitaxy growing process. After the Ge layer was formed, a Ni layer was deposited on the Ge layer. An annealing process was performed on the Ni layer to form a NiGe layer. After the annealing process, an etching process was performed to remove unreacted Ni layer at 70° C. The etching process included using an etching solvent including 1% $H_2SO_4$ diluted by propylene carbonate.

Figure 6A:
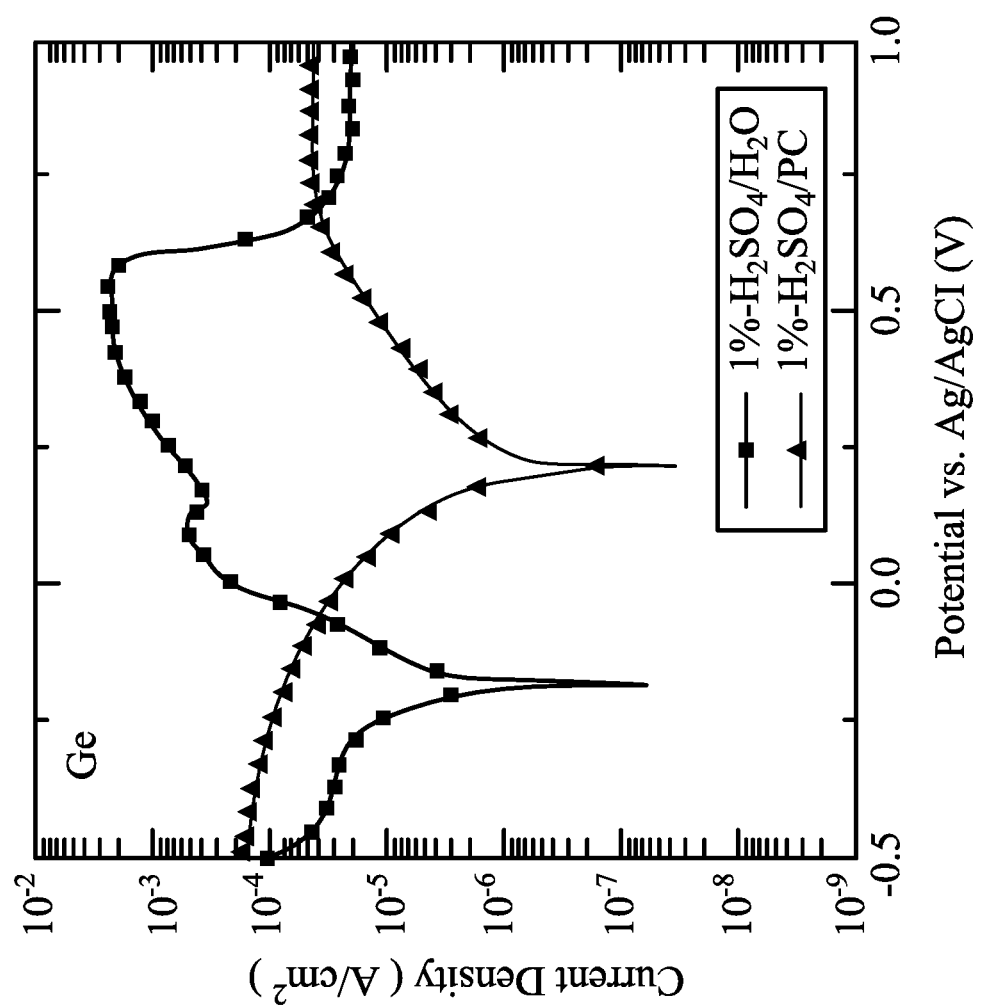
FIGS. 6A and 6B respectively show the potentiodynamic polarization curves of Ge and NiGe in accordance with an example and a comparative example.
Figure 6B:
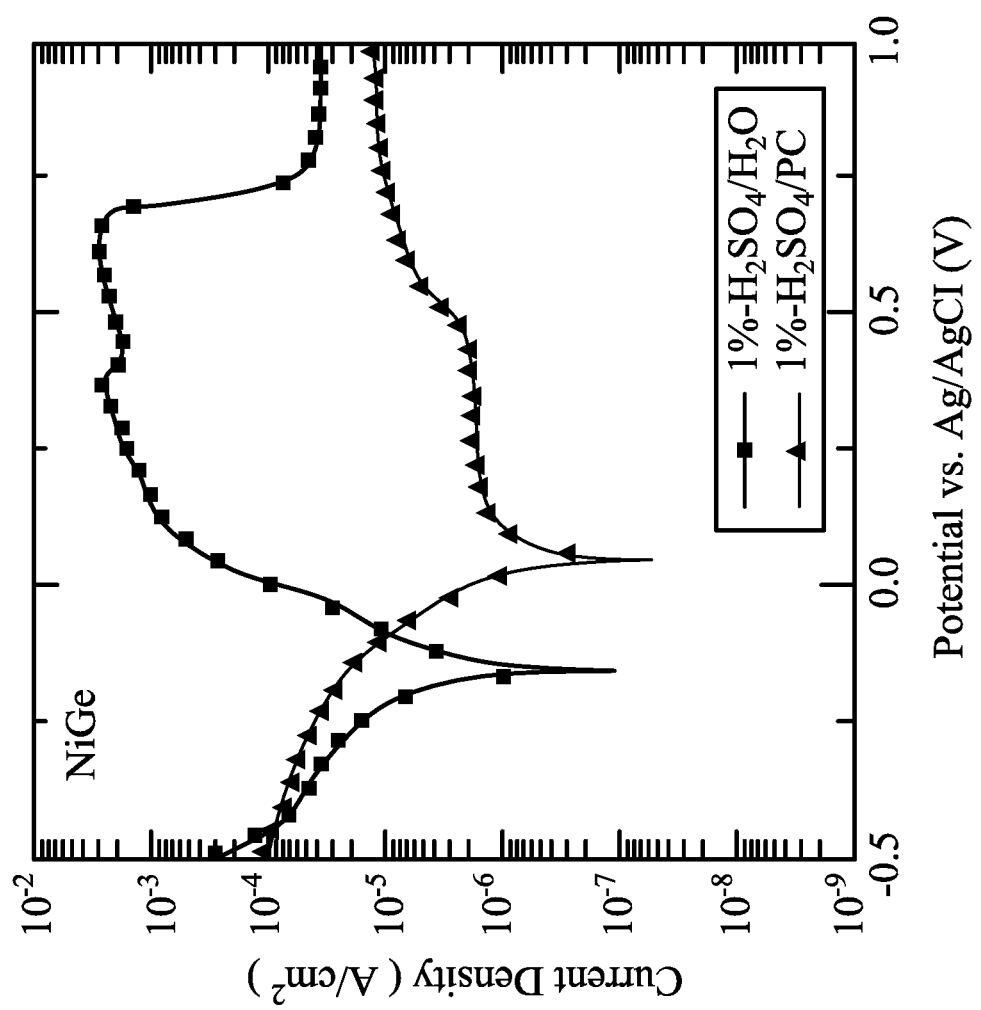

FIGS. 6A and 6B respectively show the potentiodynamic polarization curves of Ge and NiGe in Example 2 and the Comparative Example. Ag/AgCl was used as reference electrode. As shown in FIGS. 6A and 6B, Example 2 (i.e. the $H_2SO_4$/PC mixture) showed well-suppressed anodic current indicating suppressed material loss smaller than 0.5 nm. On the other hand, increased current has been observed in Comparative example (i.e. the $H_2SO_4$/$H_2O$ mixture).

In addition, the amount of material loss calculated of between open circuit potential (OCP) and OCP+0.5 V was more than 10 nm. At the current drop points, the material was fully etched. Accordingly, the etching solvent of Example 2 which included PC showed better etching ability than Comparative example.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
    forming a source/drain structure over a substrate;
    forming a metal layer over the source/drain structure;
    reacting a portion of the metal layer with the source/drain structure to form a metallic layer;
    etching an unreacted portion of the metal layer by using an etching solvent, wherein the etching solvent comprises
    a first component, comprising an acid; and
    a second component, comprising propylene carbonate (PC), ethylene carbonate (EC), diethyl carbonate (DEC), or a combination thereof; and
    forming an oxide film on a sidewall of the source/drain structure, wherein the oxide film is in direct contact with the sidewall of the source/drain structure and vertically overlaps the metallic layer, and the metallic layer is in direct contact with a top surface of the source/drain structure.

2. The method for manufacturing a semiconductor structure as claimed in claim 1, wherein the acid is $H_2SO_4$.

3. The method for manufacturing a semiconductor structure as claimed in claim 2, wherein the second component comprises propylene carbonate (PC).

4. The method for manufacturing a semiconductor structure as claimed in claim 1, wherein the etching solvent further comprises
    a third component, comprising $H_2O_2$ or ozone.

5. The method for manufacturing a semiconductor structure as claimed in claim 1, further comprising:
    forming a fin structure over the substrate;
    forming an isolation structure around the fin structure; and
    forming a gate structure across the fin structure and extending over the isolation structure,
    wherein the source/drain structure is formed in the fin structure.

6. The method for manufacturing a semiconductor structure as claimed in claim 5, wherein a bottom surface of the oxide film is substantially level with a top surface of the isolation structure.

7. A method for manufacturing a semiconductor structure, comprising:
    forming a source/drain structure over a substrate;
    forming a metal layer over the source/drain structure;
    reacting a portion of the metal layer with the source/drain structure to form a metallic layer; and
    forming an oxide film on a sidewall of the source/drain structure by using a solvent, wherein the solvent comprises
    a first component, comprising an acid; and
    a second component, comprising propylene carbonate (PC), ethylene carbonate (EC), diethyl carbonate (DEC), or a combination thereof,
    wherein the oxide film is in direct contact with the sidewall of the source/drain structure and the metallic layer is in direct contact with a top surface of the source/drain structure.

13

8. The method for manufacturing a semiconductor structure as claimed in claim 7, further comprising:
    forming a fin structure over the substrate;
    forming an isolation structure around the fin structure; and
    forming a gate structure across the fin structure and extending over the isolation structure.

9. The method for manufacturing a semiconductor structure as claimed in claim 7, wherein an unreacted portion of the metal layer is removed by the solvent.

10. The method for manufacturing a semiconductor structure as claimed in claim 7, wherein a top portion of the source/drain structure is covered by the metallic layer, and sidewalls of the source/drain structure are covered by the oxide film.

11. The method for manufacturing a semiconductor structure as claimed in claim 7, further comprising:
    forming a contact over the metallic layer.

12. The method for manufacturing a semiconductor structure as claimed in claim 11, wherein a portion of the contact extends under the source/drain structure and the metallic layer.

13. The method for manufacturing a semiconductor structure as claimed in claim 11, wherein the contact is in direct contact with the oxide film.

14. A method for manufacturing a semiconductor structure, comprising:
    forming a source/drain structure over a substrate;
    forming a metal layer over the source/drain structure;
    reacting a portion of the metal layer with the source/drain structure to form a metallic layer over the source/drain structure, wherein the metallic layer is in direct contact with a top surface of the source/drain structure;
    forming an oxide film on a sidewall of the source/drain structure by using a solvent, wherein the oxide film is in direct contact with the sidewall of the source/drain structure, and wherein the solvent comprises
        a first component, comprising an acid;
        a second component, comprising propylene carbonate (PC), ethylene carbonate (EC), diethyl carbonate (DEC), or a combination thereof; and
        a third component, comprising $H_2O_2$ or ozone;
    forming an interlayer dielectric layer covering the metallic layer; and
    forming a contact through the interlayer dielectric layer and in direct contact with the metallic layer.

15. The method for manufacturing a semiconductor structure as claimed in claim 14, further comprising:
    forming a fin structure over the substrate;
    forming an isolation structure around the fin structure;
    recessing the fin structure to form a recess in the isolation structure;
    forming the source/drain structure in the recess; and
    forming a gate structure across the fin structure.

16. The method for manufacturing a semiconductor structure as claimed in claim 15, further comprising:
    removing the oxide film to form a narrow portion of the source/drain structure before forming the interlayer dielectric layer, wherein a width of the narrow portion of the source/drain structure is less than a width of the fin structure.

17. The method for manufacturing a semiconductor structure as claimed in claim 15, wherein the contact is in direct contact with the isolation structure.

18. The method for manufacturing a semiconductor structure as claimed in claim 14, wherein the source/drain structure is separated from the interlayer dielectric layer by the metallic layer and the oxide film.

19. The method for manufacturing a semiconductor structure as claimed in claim 14, wherein the first component comprises $H_2SO_4$ and the second component comprises propylene carbonate (PC).

20. The method for manufacturing a semiconductor structure as claimed in claim 14, wherein the interlayer dielectric layer is in direct contact with the metallic layer and the source/drain structure.

* * * * *